(12) United States Patent
Chang

(10) Patent No.: US 9,870,934 B2
(45) Date of Patent: Jan. 16, 2018

(54) ELECTROSTATIC CHUCK AND TEMPERATURE-CONTROL METHOD FOR THE SAME

(71) Applicant: Micron Technology, Inc., Boise, ID (US)

(72) Inventor: Yi Chang, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 273 days.

(21) Appl. No.: 14/810,492

(22) Filed: Jul. 28, 2015

(65) Prior Publication Data

US 2017/0032989 A1  Feb. 2, 2017

(51) Int. Cl.
*G05D 23/00* (2006.01)
*H01L 21/67* (2006.01)
*H01L 21/683* (2006.01)

(52) U.S. Cl.
CPC .. *H01L 21/67248* (2013.01); *H01L 21/67109* (2013.01); *H01L 21/6831* (2013.01)

(58) Field of Classification Search
CPC ......... H01L 21/67248; H01L 21/67109; H01L 21/6831
USPC .......................... 165/288; 361/234; 62/259.3
See application file for complete search history.

(56) References Cited

U.S. PATENT DOCUMENTS

| 5,088,006 A * | 2/1992 | del Puerto | H01L 21/6838 257/714 |
| 5,474,614 A * | 12/1995 | Robbins | B25B 11/002 118/728 |
| 6,033,478 A * | 3/2000 | Kholodenko | H01L 21/6831 118/500 |
| 6,439,244 B1 * | 8/2002 | Wu | H01J 37/32082 134/1.1 |
| 6,677,167 B2 * | 1/2004 | Kanno | H01L 21/67109 355/72 |
| 6,705,095 B2 * | 3/2004 | Thompson, Jr. | F25B 39/02 62/117 |
| 2001/0034004 A1 * | 10/2001 | Kitamura | C23C 16/481 432/250 |
| 2002/0050246 A1 * | 5/2002 | Parkhe | H01L 21/67109 118/500 |
| 2004/0060925 A1 * | 4/2004 | Zhou | H05B 3/265 219/543 |
| 2005/0018376 A1 * | 1/2005 | Park | H01L 21/6831 361/234 |
| 2005/0217583 A1 * | 10/2005 | Cole, Sr. | G01R 31/2891 118/724 |
| 2007/0274020 A1 * | 11/2007 | Park | H01L 21/67109 361/234 |
| 2011/0154843 A1 | 6/2011 | Ko et al. | |

FOREIGN PATENT DOCUMENTS

TW  452916 B  9/2001
TW  I357629 B  2/2012

* cited by examiner

*Primary Examiner* — Justin Jonaitis
(74) *Attorney, Agent, or Firm* — TraskBritt

(57) ABSTRACT

An electrostatic chuck includes a chuck base and cooling pipes. The chuck base has at least four cooling zones, in which the cooling zones viewed at a direction normal to the chuck base are fan-shaped. The cooling pipes are respectively disposed in the cooling zones of the chuck base. Therefore, the cooling pipes disposed in the different cooling zones can be controlled individually.

16 Claims, 3 Drawing Sheets

ELECTROSTATIC CHUCK AND TEMPERATURE-CONTROL METHOD FOR THE SAME

BACKGROUND

Field of Invention

The present disclosure relates to an electrostatic chuck and a temperature-control method for the same.

Description of Related Art

In a reaction chamber of semiconductor device manufacturing equipment, a wafer is mounted on a chuck base for being supported during a process, in which the chuck base may be an electrostatic chuck. The chuck base is provided with a cooling system for maintaining a constant temperature of the chuck base, thereby cooling the wafer located on the chuck base. Thus, in order to prevent a potentially damaging temperature rise or a temperature unbalance between the wafer and the chuck base, the cooling system is typically associated with the chuck base.

The cooling system often directly applies a liquid or a gas coolant into the chuck base. However, even though the cooling system can cool the chuck base by applying the liquid or the gas coolant into the chuck base, delivering the liquid or the gas coolant to the inappropriate positions of the chuck base surface may introduce unexpected defects to the wafer. The wafer with the unexpected defects usually results in the reduced yield rate.

BRIEF SUMMARY

An aspect of the present disclosure provides an electrostatic chuck including a chuck base and cooling pipes. Since the cooling pipes are separately disposed in cooling zones of the chuck base, the cooling pipes can be separately controlled. Therefore, the cooling pipes delivering the cooling liquids can respectively provide the cooling zones with the cooling effects. By respectively providing the cooling zones with the cooling effects, temperatures of different areas of a wafer corresponding to the cooling zones can be separately controlled so as to adjust etching rates of these areas, and hence the reduced yield rate of the wafer is prevented.

An aspect of the present disclosure provides an electrostatic chuck including a chuck base and cooling pipes. The chuck base has at least four cooling zones, in which the cooling zones viewed at a direction normal to the chuck base are fan-shaped. The cooling pipes are respectively disposed in the cooling zones of the chuck base.

In some embodiments, the number of the cooling zones is 2N+2, where N is a positive integer.

In some embodiments, the electrostatic chuck further includes additional cooling pipes. The additional cooling pipes are respectively disposed in the cooling zones of the chuck base.

In some embodiments, each of the additional cooling pipes is surrounded by the corresponding cooling pipe in each of the cooling zones.

In some embodiments, the cooling zones are symmetric to a center of the chuck base.

In some embodiments, the cooling zones include first cooling zones and second cooling zones. The first cooling zones and the second cooling zones are arranged alternately, and an area of each of the first cooling zones is greater than an area of each of the second cooling zones.

In some embodiments, the cooling zones viewed at a direction normal to the chuck base have the same area.

In some embodiments, a first group and a second group of the cooling pipes are respectively provided with a first cooling liquid and a second cooling liquid, and a liquid velocity of the first cooling liquid is different from a liquid velocity of the second cooling liquid.

In some embodiments, the liquid velocity of the first cooling liquid is faster than the liquid velocity of the second cooling liquid.

In some embodiments, the cooling zones include first cooling zones and second cooling zones. The first cooling zones and the second cooling zones are arranged alternately, and the liquid velocity of the cooling pipes in the first cooling zones is different from the liquid velocity of the cooling pipes in the second cooling zones.

In some embodiments, the liquid velocity of the cooling pipes in the first cooling zones is faster than the liquid velocity of the cooling pipes in the second cooling zones.

In some embodiments, the cooling pipes are configured to deliver high-specific-heat liquid.

In some embodiments, the number of the cooling zones is four. The cooling zones includes a first cooling region, a second cooling region, a third cooling region, and a fourth cooling region arranged clockwise in sequence. The first cooling zone and the third cooling zone are symmetric to a center of the chuck base, and the second cooling zone and the fourth cooling zone are symmetric to the center of the chuck base.

In some embodiments, the number of the cooling zones is four. Each of the cooling zones viewed at a direction normal to the chuck base occupies a quarter area of the chuck base.

An aspect of the present disclosure provides an electrostatic chuck including a chuck base, first cooling pipes, and second cooling pipes. The chuck base has two first cooling zones and two second cooling zones. The first cooling zones and the second cooling zones viewed at a direction normal to the chuck base are fan-shaped and are arranged alternately. The first cooling pipes are disposed in the first cooling zones of the chuck base, in which the first cooling pipes are provided with cooling liquid with a first liquid velocity. The second cooling pipes are disposed in the second cooling zones of the chuck base, in which the second cooling pipes are provided with cooling liquid with a second liquid velocity. The first liquid velocity is greater than the second liquid velocity.

In some embodiments, the two first cooling zones are symmetrical to a center of the chuck base, and the two second cooling zones are symmetrical to the center of the chuck base.

In some embodiments, each of the first cooling zones and the second cooling zones viewed at a direction normal to the chuck base occupies a quarter area of the chuck base.

In some embodiments, the number of the first cooling pipes disposed in each of the first cooling zones is two, and one of the first cooling pipes is surrounded by another of the first cooling pipes.

In some embodiments, the number of the second cooling pipes disposed in each of the second cooling zones is two, and one of the second cooling pipes is surrounded by another of the second cooling pipes.

An aspect of the present disclosure provides a temperature-control method for an electrostatic chuck. The method includes a step that individually controls temperatures of at least four cooling zones of a chuck base, in which the cooling zones viewed at a direction normal to the chuck base are fan-shaped.

In some embodiments, the method further includes a number of steps. A first group of cooling pipes disposed in the cooling zones is provided with a first cooling liquid. A second group of the cooling pipes disposed in the cooling zones is provided with a second cooling liquid. Liquid velocity of the first cooling liquid is controlled to be V1 and liquid velocity of the second cooling liquid is controlled to be V2, and V1>V2.

In some embodiments, the method further includes controlling the liquid velocities of the first cooling liquid and the second cooling liquid to be distant from or closer to each other.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
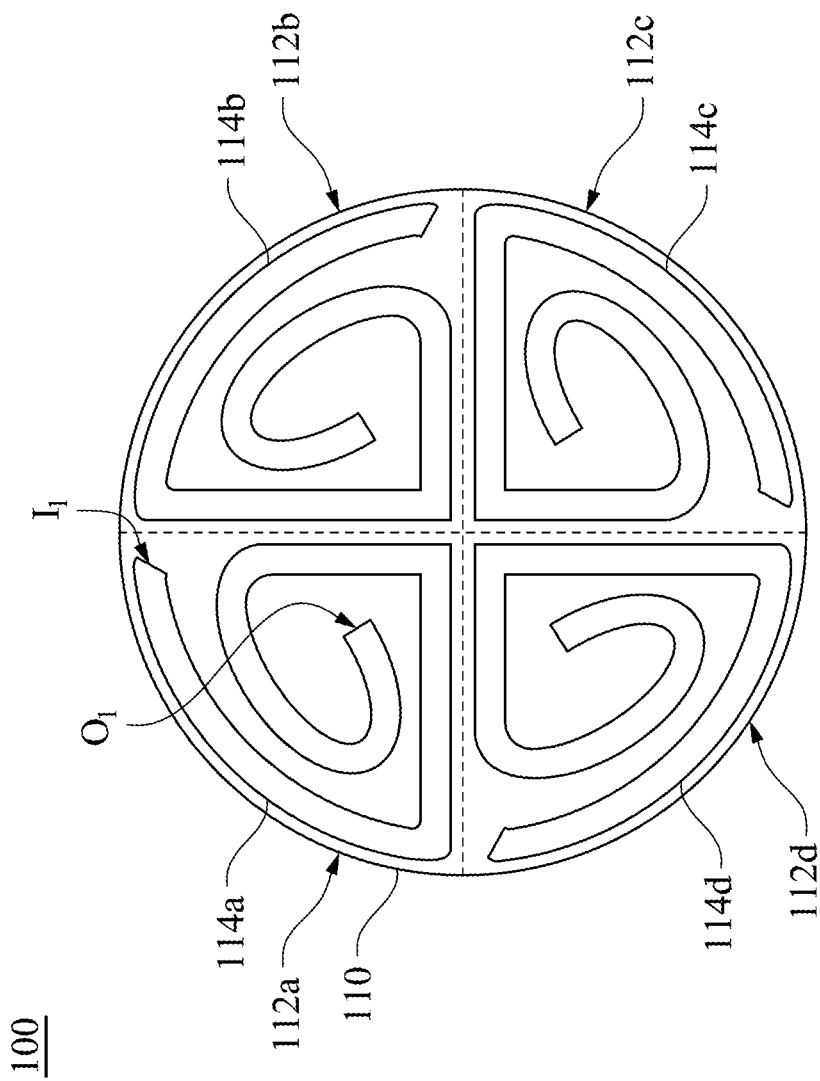
FIG. 1 is a schematic top view of an electrostatic chuck according to a first embodiment of this disclosure.

Reference will now be made in detail to the present embodiments of the invention, examples of which are illustrated in the accompanying drawings. Wherever possible, the same reference numbers are used in the drawings and the description to refer to the same or like parts.

To avoid delivering the liquid or the gas coolant to the inappropriate positions of the chuck base surface, which may cause the wafer to have an unexpected defect, an electrostatic chuck of the present disclosure includes a chuck base having at least four cooling zones, in which cooling pipes are respectively disposed in the cooling zones of the chuck base. Therefore, temperatures of the cooling zones can be separately controlled, and an etching rate of a wafer mounted on the chuck base can be controlled to be uniform by separately controlling the temperatures of the cooling zones.

FIG. 1 is a schematic top view of an electrostatic chuck 100 according to a first embodiment of this disclosure. An electrostatic chuck 100 includes a chuck base 110 and cooling pipes 114a-114d. The chuck base 110 has four cooling zones 112a-112d, in which the cooling zones 112a-112d viewed at a direction normal to the chuck base 110 are fan-shaped. The cooling pipes 114a-114d are respectively disposed in the cooling zones 112a-112d of the chuck base 110, in which each of the cooling pipes 114a-114d has an inlet I1 and an outlet O1. Thus, each of the cooling pipes 114a-114d is disposed in one of the cooling zones 112a-112d. Furthermore, in some embodiments, the chuck base 110 has at least four cooling zones.

Under this configuration, the cooling pipes are configured to deliver high-specific-heat liquid, and the high-specific-heat liquid can be used as cooling liquid. Since the cooling pipes 114a-114d are separately disposed in the chuck base 110, each of the cooling pipes 114a-114d can be provided with the cooling liquid. Thus, the cooling pipes 114a-114d delivering the cooling liquids can respectively provide the cooling zones 112a-112d with a cooling effect. Therefore, temperatures of the cooling zones 112a-112d of the chuck base 110 can be separately controlled. In other words, the cooling zones 112a-112d of the chuck base 110 may have different temperatures (different from each other), for example, the temperature of the cooling zone 112a may be lower than the temperatures of the cooling zones 112b-112d.

During an etching process, a wafer (not illustrated) may be mounted on a surface of the chuck base 110 so as to perform sequent processes. In the etching process, the etching rate of the wafer may relate to a number of factors, for example, temperature is one of the factors, and a relationship between the temperature and the etching rate is similar to a positive correlation. By separately controlling the temperatures of the cooling zones 112a-112d of the chuck base 110, temperatures of different areas of the wafer corresponding to the cooling zones 112a-112d can be separately controlled to increase or decrease. That is, since the relationship between the temperature and the etching rate is similar to the positive correlation, the etching rates of these areas of the wafer corresponding to the cooling zones 112a-112d can be separately controlled to increase or decrease.

As previously described, since the etching rates of the areas of the wafer may be affected by a number of factors, for example, a distribution of etching gas on the wafer, a concentration of the etching gas, or locations of gas nozzles on the wafer, the complex factors may cause the etching rates of the areas of the wafer to be non-uniform. Therefore, by separately controlling the temperatures of the cooling zones 112a-112d of the chuck base 110, the etching rates of the areas of the wafer can be controlled to be uniform.

For example, under a situation that the etching rate of the area of the wafer corresponding to the cooling zone 112a is higher than the etching rates of the areas of the wafer corresponding to the cooling zones 112b-112d, the cooling pipes 114a-114d disposed in the cooling zones 112a-112d are provided with the cooling liquids. The cooling pipe 114a is provided with first cooling liquid and the cooling pipes 114b-114d are provided with second cooling liquids, in which a liquid velocity of the first cooling liquid is different from a liquid velocity of the second cooling liquid. In the present embodiment, the liquid velocity of the first cooling liquid is faster than the liquid velocity of the second cooling liquid. Thus, the liquid velocity of the first cooling liquid is controlled to be V1, the liquid velocity of the second cooling liquid is controlled to be V2, and V1>V2.

Since the liquid velocity of the first cooling liquid is faster than the liquid velocity of the second cooling liquid, the cooling zone 112a can obtain the greater cooling effect from the cooling pipe 114a than the other cooling zones 112b-112d. Therefore, the etching rate of the area of the wafer corresponding to the cooling zone 112a can be reduced to be uniform with the etching rates of the other areas of the wafer. In other words, once the etching rates of the areas of the wafer are non-uniform, the liquid velocities of the first cooling liquid and the second cooling liquid can be controlled to be distant from or closer to each other, so as to uniformize the etching rates of the areas of the wafer.

Alternatively, in another situation, once the etching rates of the areas of the wafer corresponding to the cooling zones 112a and 112c are greater than the etching rates of the areas of the wafer corresponding to the cooling zones 112b and 112d, the cooling pipes 114a and 114c are provided with the first cooling liquid and the cooling pipes 114b and 114d are provided with the second cooling liquids. Similarly, the liquid velocity of the first cooling liquid is faster than the liquid velocity of the second cooling liquid, and therefore etching rates of the areas of the wafer corresponding to the cooling zones 112a and 112c can be reduced to be uniform with the other areas of the wafer.

In the present embodiment, the cooling zones 112a-112d viewed at a direction normal to the chuck base 110 have the same area. Therefore, the cooling zones 112a-112d are symmetric to a center of the chuck base 110, and each of the cooling zones 112a-112d viewed at a direction normal to the chuck base 110 occupies a quarter area of the chuck base 110. However, the arrangement of the cooling zones 112a-112d with the cooling pipes 114a-114d is not limited thereto, and a person having ordinary skill in the art may choose a proper arrangement of the cooling zones 112a-112d with the cooling pipes 114a-114d. For example, the arrangement of the cooling zones 112a-112d with the cooling pipes 114a-114d can be adjusted according to the locations of gas nozzles on the wafer.

Figure 2:
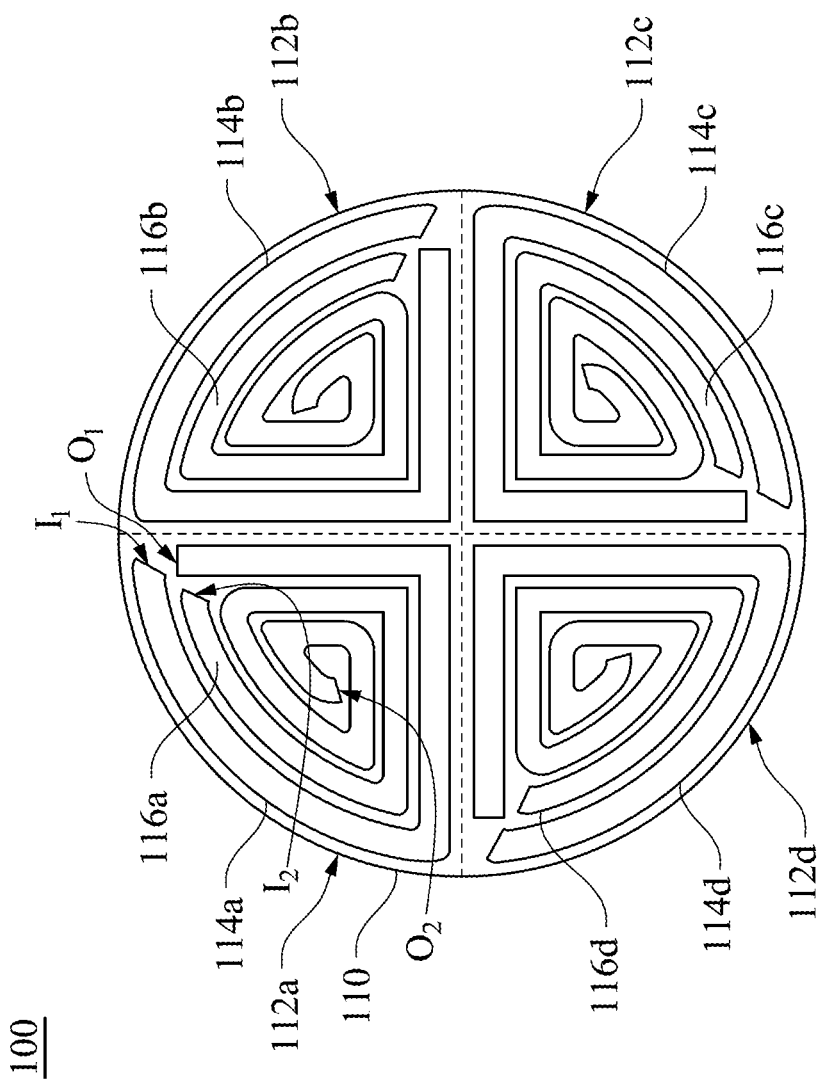
FIG. 2 is a schematic top view of an electrostatic chuck according to a second embodiment of this disclosure.

FIG. 2 is a schematic top view of an electrostatic chuck 100 according to a second embodiment of this disclosure. The difference between the present embodiment and the first embodiment is that the electrostatic chuck 100 of the present embodiment further includes additional cooling pipes 116a-116d, in which each of the additional cooling pipes 116a-116d has an inlet I2 and an outlet O2.

In the present embodiment, the additional cooling pipes 116a-116d are respectively disposed in the cooling zones 112a-112d of the chuck base 110. That is, each of the additional cooling pipes 116a-116d is located in the corresponding cooling zone (one of cooling zones 112a-112d). Therefore, the number of the pipes disposed in each of the cooling zones 112a-112d is two, and one of the pipes is the cooling pipe (one of the cooling pipes 114a-114d) and another of the pipes is the additional cooling pipe (one of the additional cooling pipes 116a-116d). Furthermore, the additional cooling pipes 116a-116d are respectively surrounded by the cooling pipes 114a-114d. For example, in the cooling zone 112a, the additional cooling pipe 116a is surrounded by the cooling pipe 114a.

Under this configuration, since the pipes of each of the cooling zones 112a-112d are arranged with a higher density, the capacity usage of the cooling liquid in each of the cooling zones 112a-112d is increased. Therefore, each of the cooling zones 112a-112d can provide the wafer mounted on the chuck base 110 with the greater cooling effect.

Figure 3:
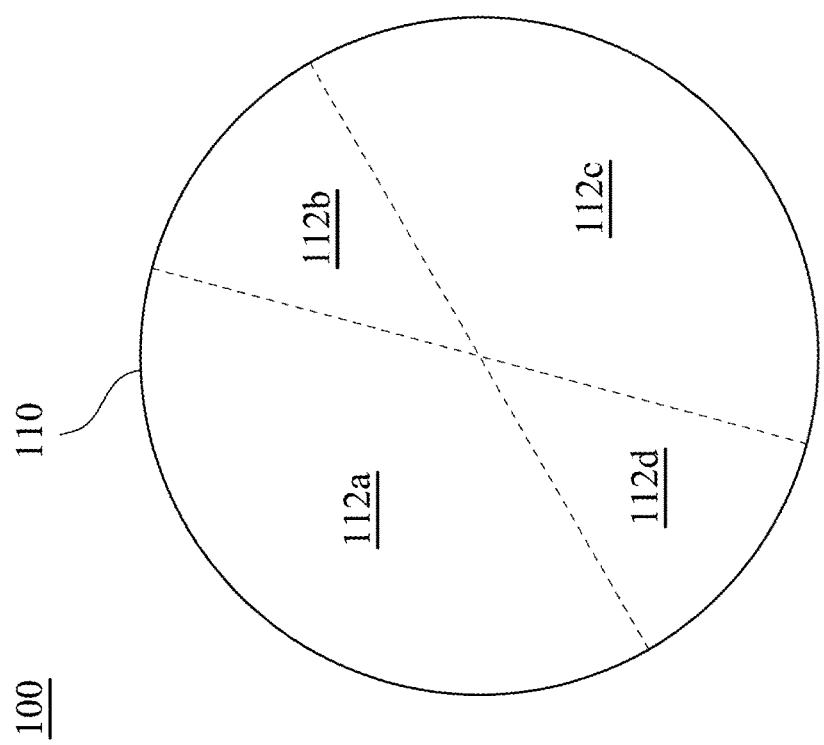
FIG. 3 is a schematic top view of an electrostatic chuck according to a third embodiment of this disclosure.

FIG. 3 is a schematic top view of an electrostatic chuck 100 according to a third embodiment of this disclosure. For making the illustration succinct, the cooling pipes are omitted, and only the cooling zones 112a-112d are illustrated in FIG. 3. The difference between the present embodiment and the first embodiment is that the arrangement of the cooling zones 112a-112d of the chuck base 110 have different areas.

In the present embodiment, the cooling zones 112a and 112c can be taken as the first cooling zones, and the cooling zones 112b and 112d can be taken as the second cooling zones. The cooling zones 112a and 112c taken as the first cooling zones and the cooling zones 112b and 112d taken as the second cooling zones are arranged alternately, and an area of each of the first cooling zones is greater than an area of each of the second cooling zones. For example, the cooling zones 112a and 112c have the same area, the cooling zones 112b and 112d have the same area, and the area of each of the cooling zones 112a and 112c is greater than the area of each of the cooling zones 112b and 112d.

In addition, each pair of the cooling zones 112a-112d is symmetric to a center of the chuck base 110. For example, the cooling zones 112a and 112c are symmetric to the center of the chuck base, and the cooling zones 112b and 112d are symmetric to the center of the chuck base 110.

Under this configuration, the cooling zones 112a-112d of the chuck base 110 of the electrostatic chuck 100 can provide the wafer with a cooling effect that corresponds to a non-homogeneous distribution of the etching gas on the wafer. In other words, according to the different distributions of the etching gas on the wafer, the areas of the cooling zones 112a-112d can be adjusted further.

Figure 4:
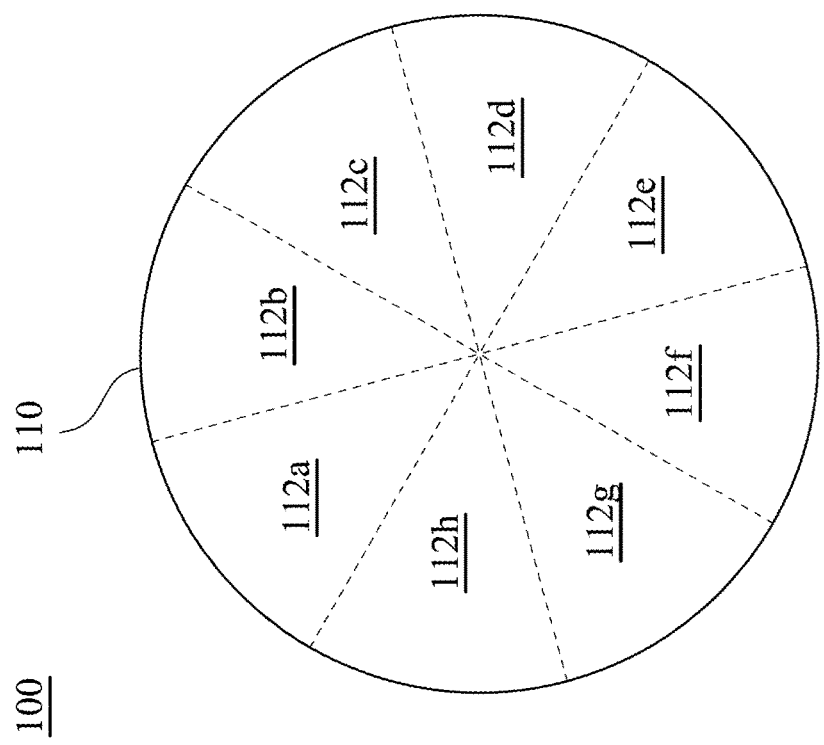
FIG. 4 is a schematic top view of an electrostatic chuck according to a fourth embodiment of this disclosure.

FIG. 4 is a schematic top view of an electrostatic chuck 100 according to a fourth embodiment of this disclosure. Similarly, for making the illustration succinct, the cooling pipes are omitted, and only the cooling zones 112a-112h are illustrated in FIG. 4. The difference between the present embodiment and the first embodiment is that the number of the cooling zones 112a-112h of the present embodiment is increased.

In the present embodiment, the number of the cooling zones 112a-112h is eight. Since the number of the cooling zones 112a-112h that can be separately controlled is increased, the temperature distribution of the chuck base 110 can be controlled further. Furthermore, in order to correspond to the different conditions of the etching process, in some embodiments, the number of the cooling zones is 2N+2, where N is a positive integer.

In summary, since the cooling pipes are separately disposed in the cooling zones of the chuck base of the electrostatic chuck of the present disclosure, the cooling liquids of the cooling pipes can be separately controlled. The cooling pipes delivering the cooling liquids can respectively provide the cooling zones 112a-112d with the cooling effects. By respectively providing the cooling effects, the temperatures of the areas of the wafer corresponding to the cooling zones can be separately controlled so as to adjust the etching rates of these areas. Therefore, the etching rates of the different areas of the wafer can be controlled to be uniform. In other words, once the etching rates of the areas of the wafer are non-uniform, the liquid velocities of cooling liquids in the cooling pipes can be controlled to be distant from or closer to each other so as to uniformize the etching rates.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this disclosure provided they fall within the scope of the following claims.

What is claimed is:

1. An electrostatic chuck, comprising:
    a chuck base having at least four cooling zones, wherein the cooling zones viewed at a direction normal to the chuck base are fan-shaped;
    a plurality of cooling pipes respectively disposed in the cooling zones of the chuck base;
    a plurality of additional cooling pipes respectively disposed in the cooling zones of the chuck base;
    wherein each of the additional cooling pipes is surrounded by a corresponding cooling pipe in each of the cooling zones.

2. The electrostatic chuck of claim 1, wherein the number of the cooling zones is 2N+2, where N is a positive integer.

3. The electrostatic chuck of claim 1, wherein the cooling zones are symmetric to a center of the chuck base.

4. The electrostatic chuck of claim 1, wherein the cooling zones comprise a plurality of first cooling zones and a plurality of second cooling zones, the first cooling zones and the second cooling zones are arranged alternately, and an area of each of the first cooling zones is greater than an area of each of the second cooling zones.

5. The electrostatic chuck of claim 1, wherein the cooling zones viewed at a direction normal to the chuck base have the same area.

6. The electrostatic chuck of claim 1, wherein the number of the cooling zones is four, and the cooling zones comprise a first cooling region, a second cooling region, a third cooling region, and a fourth cooling region arranged clockwise in sequence, wherein the first cooling zone and the third cooling zone are symmetric to a center of the chuck base, and the second cooling zone and the fourth cooling zone are symmetric to the center of the chuck base.

7. The electrostatic chuck of claim 1, wherein the number of the cooling zones is four, and each of the cooling zones viewed at a direction normal to the chuck base occupies a quarter area of the chuck base.

8. An electrostatic chuck, comprising:
a chuck base having at least four cooling zones, wherein the cooling zones viewed at a direction normal to the chuck base are fan-shaped; and
a plurality of cooling pipes respectively disposed in the cooling zones of the chuck base;
wherein a first group and a second group of the cooling pipes are respectively provided with a first cooling liquid and a second cooling liquid, and a liquid velocity of the first cooling liquid is different from a liquid velocity of the second cooling liquid.

9. The electrostatic chuck of claim 8, wherein the liquid velocity of the first cooling liquid is faster than the liquid velocity of the second cooling liquid.

10. An electrostatic chuck, comprising:
a chuck base having two first cooling zones and two second cooling zones, wherein the first cooling zones and the second cooling zones viewed at a direction normal to the chuck base are fan-shaped and are arranged alternately;
a plurality of first cooling pipes disposed in the first cooling zones of the chuck base, wherein the first cooling pipes are provided with cooling liquids with a first liquid velocity; and
a plurality of second cooling pipes disposed in the second cooling zones of the chuck base, wherein the second cooling pipes are provided with cooling liquids with a second liquid velocity, and the first liquid velocity is greater than the second liquid velocity.

11. The electrostatic chuck of claim 10, wherein the two first cooling zones are symmetrical to a center of the chuck base, and the two second cooling zones are symmetrical to the center of the chuck base.

12. The electrostatic chuck of claim 10, wherein each of the first cooling zones and the second cooling zones viewed at a direction normal to the chuck base occupies a quarter area of the chuck base.

13. The electrostatic chuck of claim 10, wherein the number of the first cooling pipes disposed in each of the first cooling zones is two, and one of the first cooling pipes is surrounded by another of the first cooling pipes.

14. The electrostatic chuck of claim 10, wherein the number of the second cooling pipes disposed in each of the second cooling zones is two, and one of the second cooling pipes is surrounded by another of the second cooling pipes.

15. A temperature-control method for an electrostatic chuck, comprising:
individually controlling temperatures of at least four cooling zones of a chuck base, wherein the cooling zones viewed at a direction normal to the chuck base are fan-shaped;
providing a first group of a plurality of cooling pipes disposed in the cooling zones with first cooling liquid;
providing a second group of a plurality of cooling pipes disposed in the cooling zones with second cooling liquid; and
controlling liquid velocity of the first cooling liquid to be V1 and controlling liquid velocity of the second cooling liquid to be V2, and V1>V2.

16. The temperature-control method of claim 15, further comprising:
controlling the liquid velocities of the first cooling liquid and the second cooling liquid to be distant from or closer to each other.

* * * * *

UNITED STATES PATENT AND TRADEMARK OFFICE
CERTIFICATE OF CORRECTION

PATENT NO. : 9,870,934 B2  
APPLICATION NO. : 14/810492  
DATED : January 16, 2018  
INVENTOR(S) : Yi Chang Page 1 of 1

It is certified that error appears in the above-identified patent and that said Letters Patent is hereby corrected as shown below:

On the Title Page

In ITEM (72) Inventor:   change "New Taipei (TW)" to --New Taipei City (TW)--

Signed and Sealed this  
Twelfth Day of June, 2018

Andrei Iancu  
*Director of the United States Patent and Trademark Office*